United States Patent
McCarthy et al.

(10) Patent No.: US 12,289,391 B2
(45) Date of Patent: Apr. 29, 2025

(54) LOW LATENCY DATA HANDOFF USING PHASE ROTATION AND CLOCK GAPPING

(71) Applicant: CIENA CORPORATION, Hanover, MD (US)

(72) Inventors: Andrew McCarthy, Stittsville (CA); Sadok Aouini, Gatineau (CA); Manoj Verghese, Ottawa (CA); Naim Ben-Hamida, Nepean (CA)

(73) Assignee: CIENA CORPORATION, Hanover, MD (US)

( * ) Notice: Subject to any disclaimer, the term of this patent is extended or adjusted under 35 U.S.C. 154(b) by 489 days.

(21) Appl. No.: 17/939,118

(22) Filed: Sep. 7, 2022

(65) Prior Publication Data

US 2024/0080178 A1 Mar. 7, 2024

(51) Int. Cl.
*H03K 3/037* (2006.01)
*H04L 7/033* (2006.01)

(52) U.S. Cl.
CPC ............ *H04L 7/0331* (2013.01); *H03K 3/037* (2013.01)

(58) Field of Classification Search
CPC ..... H04L 7/0331; H03K 3/0233; H03K 3/037
USPC ................................ 375/376, 328, 331, 351
See application file for complete search history.

(56) References Cited

U.S. PATENT DOCUMENTS

| | | | | |
|---|---|---|---|---|
| 4,928,275 A | * | 5/1990 | Moore | H04J 3/076 370/506 |
| 5,535,216 A | * | 7/1996 | Goldman | H04N 7/56 725/98 |
| 6,501,809 B1 | * | 12/2002 | Monk | H04J 3/0632 375/372 |
| 6,907,541 B1 | * | 6/2005 | Padmanabhan | G06F 1/04 375/372 |
| 8,855,258 B1 | * | 10/2014 | Do | H04J 3/076 375/376 |

* cited by examiner

*Primary Examiner* — Qutbuddin Ghulamali
(74) *Attorney, Agent, or Firm* — Guntin & Gust, PLC; Kenneth S. Kwan

(57) ABSTRACT

Aspects of the subject disclosure may include, for example, a device including a phase rotator configured to receive a read clock, a flip flop configured to obtain an incoming data stream, and a controller. The controller may be configured to control the phase rotator to perform phase rotation of the read clock based on information-carrying level transitions in the incoming data stream, cause a gapped read clock and an inversion of the gapped read clock to be derived in accordance with the phase rotation, where the gapped read clock being derived via gapping operations associated with the read clock, and output clock selection signals that enable the flip flop to selectively sample the incoming data stream using the gapped read clock and the inversion, thereby facilitating a data handoff between asynchronous clock domains. Other embodiments are disclosed.

20 Claims, 10 Drawing Sheets

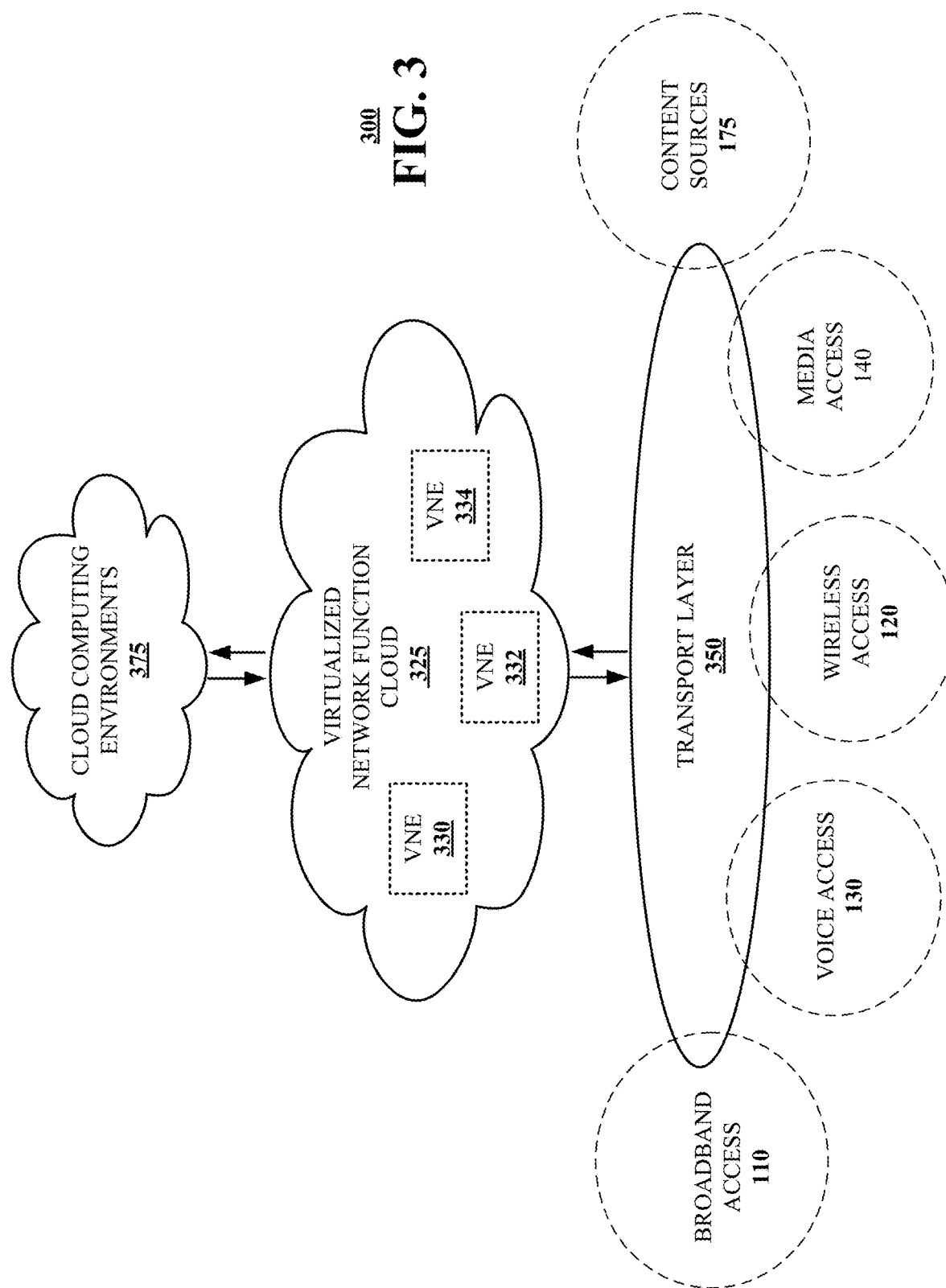

# LOW LATENCY DATA HANDOFF USING PHASE ROTATION AND CLOCK GAPPING

FIELD OF THE DISCLOSURE

The subject disclosure relates to data handoff using phase rotation and clock gapping.

BACKGROUND

Application-specific integrated circuits (ASICs) may be deployed in various environments, such as a switch fabric or other transport system for data center interconnect applications. Where an ASIC forwards data obtained from a given upstream system, the incoming data generally needs to be transferred from the upstream system's write (or source) clock domain to a local clock in a read (or destination) clock domain. These two clocks are asynchronous since they are provided by independent sources.

BRIEF DESCRIPTION OF THE DRAWINGS

Reference will now be made to the accompanying drawings, which are not necessarily drawn to scale, and wherein:

FIG. 3 is a block diagram illustrating an example, non-limiting embodiment of a virtualized communications network in accordance with various aspects described herein.

DETAILED DESCRIPTION

Figure 1A:
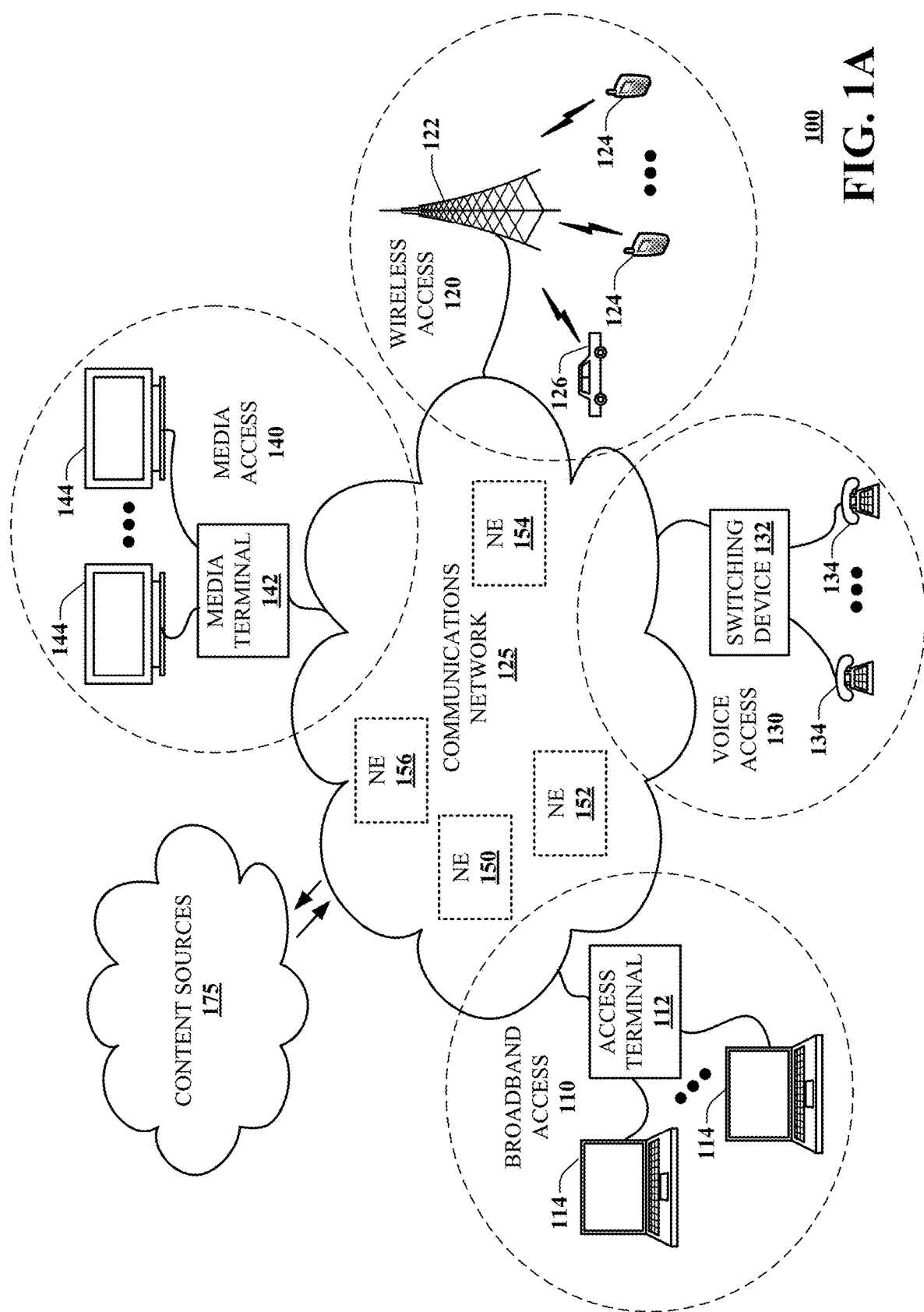
FIG. 1A is a block diagram illustrating an exemplary, non-limiting embodiment of a communications network in accordance with various aspects described herein.

A handoff between asynchronous clocks constitutes a crossing of clock domains, which can lead to metastability—i.e., where set up and hold time (or timing margin) requirements of one or more local flip flops are not met. Unpredictable logic circuit behavior can result if metastability is not addressed.

Conventional solutions include the use of Gray Coding and handshaking techniques. Gray Coding involves encoding data, on the write clock side, such that at most one bit is different between the current write data and the previous write data, which guarantees that only one of the two values is sampled. This prevents sampling of values that are never "seen" on the write clock side (which can otherwise occur if, due to uncertainty introduced, only a subset of the multiple changing bits is captured on the read clock side). However, Gray Coding is generally not used in data path applications due to arbitrariness of the data, where an appropriate transition sequence cannot be encoded in advance. Rather, the use of Gray Coding is limited to situations where the incoming data follows a predetermined sequence.

Handshaking involves writing data, on the write clock side, into a storage element and passing a flag to the read clock domain using one of the aforementioned conventional methods. When the flag reaches the read clock domain, the data is determined to be stable and can be safely read out. In a situation where the incoming data changes every clock cycle, a similar approach can be used in which multiple storage elements (i.e., a first-in-first-out (FIFO) system) are employed and the flag is defined as the latest write address. Here, control logic separates read pointers (read address generation) from write pointers (write address generation) and write data is stored until it is overwritten by new write data, which provides the necessary timing margin to avoid metastability. However, this separation yields multiple cycles of latency as well as added power consumption.

ASICs may be deployed in environments (e.g., a switch fabric) that have low latency requirements. Thus, introducing high levels of latency, even if to facilitate handoff between asynchronous clocks, can negatively impact system operations. Further, while synchronous (rather than asynchronous) clocks can alternatively be used throughout a device (or ASIC), this has its own difficulties—i.e., fractional clock multiplication and issues relating to handling of failed lines or client signals.

The subject disclosure describes, among other things, illustrative embodiments of a method and system for low-latency, low-power (e.g., multiple-lane) data handoff between two asynchronous clock domains. In exemplary embodiments, a circuit system may provide a destination (or read) clock that is (e.g., slightly) faster than an asynchronous source (or write) clock. As write data arrives from an upstream system according to the source clock, the write data can be sampled based on clocks in the read clock domain (described in more detail below). To ensure that all arriving write data is captured, the read clock needs only be marginally (e.g., a few parts per million (ppm)) faster than the source clock.

In one or more embodiments, the circuit system may include a flip flop that receives the write data. The circuit system may be configured to generate a gapped version of the read clock (i.e., where clock gaps are introduced at specific locations of the clock waveform) and an inverted version of the gapped clock. In exemplary embodiments, the circuit system may be configured to selectively operate the flip flop using the gapped and inverted gapped clocks to ensure that the write data is sampled only once per write clock cycle and with sufficient timing margin (i.e., that exceeds a set up and hold time associated with the flip flop). That is, the clock actually used to sample the write data—also referred to herein as the sampling clock—may be switched between the gapped clock and the inverted gapped clock at particular points in time to ensure that there is sufficient timing margin to avoid metastability.

In various embodiments, the circuit system may include a timing recovery/phase rotation controller and a phase rotator (e.g., a digital-to-phase converter (DPC)) that leverages a digital phase-locked loop (PLL) to match the frequency of the incoming write data. In one or more embodiments, the phase rotator may facilitate phase tracking such that the sampling clock is switched between the gapped and inverted gapped clocks to (e.g., always) allow for sufficient timing margin. In various embodiments, the phase rotator may facilitate phase tracking to define the gaps for the gapped clock (and thus also the inverted clock) to maintain synchronicity with the source clock. In particular, the rate of rotation of the phase rotator may provide a measure of a difference between the source clock and the read clock, where each full rotation of the phase rotator may be indicative of a full additional clock cycle of phase on the read clock side as compared to the source clock. In this way, the read clock may be gated so as to maintain synchronicity with the source clock and thus prevent sampling of the same write data twice. Every half rotation of the phase rotator may be used to switch between the gapped clock and the inverted gapped clock. In certain embodiments, the phase rotator may, based on the aforementioned frequency matching, utilize the read clock to generate a write clock that is a local reproduction of the source clock of the write data.

Exemplary embodiments, described herein, thus leverage analog components to address a problem that is conventionally addressed entirely in the digital space—e.g., a phase rotator is employed in exemplary embodiments; for calibration, sample-scope logic may be employed as described herein; and/or in a case where a source clock is not provided along with corresponding write data, clock-data recovery (CDR) logic may be employed. The exemplary circuit system allows a bus of data to be passed between two asynchronous clocks (e.g., at wire speed) with no added latency (and certainly with less latency as compared to conventional FIFO solutions) and without a need for a dramatically faster sampling clock (since the read clock only needs to be a few ppm faster than the source clock). While there is normally a risk of metastability when directly sampling data with asynchronous clocks (i.e., due to gradual drift in the write and read clock edges with respect to one another), intelligent switching between the gapped and inverted gapped clocks in the read clock domain, as described herein, (e.g., always) ensures that sufficient timing margin is available, thereby avoiding the problem of metastability altogether.

Exemplary embodiments eliminate a need for the above-described conventional uses of Gray Coding or handshaking/FIFO techniques, all of which come with shortcomings. For instance, direct data sampling, as described herein, allows for a reduction in latency as compared with conventional handoff solutions, thereby providing a competitive advantage in low-latency applications. Exemplary embodiments may minimize or reduce latency to a lowest possible latency in a data handoff. In addition, the exemplary circuit system utilizes (e.g., only) a single PLL, since the small difference in speed between the read clock and the source clock allows both clocks to be generated on the same PLL (where rate differentiation can be obtained via a phase rotator and associated control/detector logic), which reduces or eliminates a need for additional PLL(s) or clock domain (s) that would otherwise be required in some conventional solutions. This advantageously provides for a lower power, smaller footprint implementation.

Further, the system/method described herein allows for synchronous data handoffs for multiple lanes of incoming data (each having its own sampling frequency) via a single clock tree, which also reduces power consumption and latency as compared to conventional implementations.

One or more aspects of the subject disclosure include a device, comprising a phase rotator configured to receive a read clock, a flip flop configured to obtain an incoming data stream, and a controller. The controller may be configured to control the phase rotator to perform phase rotation of the read clock based on information-carrying level transitions in the incoming data stream, and cause a gapped read clock and an inversion of the gapped read clock to be derived in accordance with the phase rotation, the gapped read clock being derived via gapping operations associated with the read clock. The controller may further be configured to output clock selection signals that enable the flip flop to selectively sample the incoming data stream using the gapped read clock and the inversion, thereby facilitating a data handoff between asynchronous clock domains.

One or more aspects of the subject disclosure include a system, comprising a phase rotator configured to receive a read clock, a sampling device configured to obtain an incoming data stream, and a controller. The controller may be configured to control the phase rotator to perform phase rotation of the read clock based on information-carrying level transitions in the incoming data stream, and cause a gapped read clock and an inversion of the gapped read clock to be derived in accordance with the phase rotation, the gapped read clock being derived via gapping operations associated with the read clock. The controller may further be configured to output clock selection signals that enable the sampling device to selectively sample the incoming data stream using the gapped read clock and the inversion, thereby facilitating a data handoff between asynchronous clock domains.

One or more aspects of the subject disclosure include a method. The method can comprise receiving, by a phase rotator, a read clock, obtaining, by a flip flop, an incoming data stream, controlling, by a controller, the phase rotator to perform phase rotation of the read clock based on information-carrying level transitions in the incoming data stream, and causing, by the controller, a gapped read clock and an inversion of the gapped read clock to be derived in accordance with the phase rotation, the gapped read clock being derived via gapping operations associated with the read clock. The method can further comprise outputting, by the controller, clock selection signals that enable the flip flop to selectively sample the incoming data stream using the gapped read clock and the inversion, thereby facilitating a data handoff between asynchronous clock domains.

Other embodiments are described in the subject disclosure.

Referring now to FIG. 1A, a block diagram is shown illustrating an example, non-limiting embodiment of a system 100 in accordance with various aspects described herein. For example, system 100 can facilitate, in whole or in part, low-latency, low-power data handoff between two asynchronous clock domains as described herein with respect to one or more of FIGS. 2A-2D. In particular, a communications network 125 is presented for providing broadband access 110 to a plurality of data terminals 114 via access terminal 112, wireless access 120 to a plurality of mobile devices 124 and vehicle 126 via base station or access point 122, voice access 130 to a plurality of telephony devices 134, via switching device 132 and/or media access 140 to a plurality of audio/video display devices 144 via media terminal 142. In addition, communications network 125 is coupled to one or more content sources 175 of audio, video, graphics, text and/or other media. While broadband access 110, wireless access 120, voice access 130 and media access 140 are shown separately, one or more of these forms of access can be combined to provide multiple access services to a single client device (e.g., mobile devices 124 can receive media content via media terminal 142, data terminal 114 can be provided voice access via switching device 132, and so on).

The communications network 125 includes a plurality of network elements (NE) 150, 152, 154, 156, etc. for facilitating the broadband access 110, wireless access 120, voice access 130, media access 140 and/or the distribution of content from content sources 175. The communications network 125 can include a circuit switched or packet switched network, a voice over Internet protocol (VoIP) network, Internet protocol (IP) network, a cable network, a passive or active optical network, a 4G, 5G, or higher generation wireless access network, WIMAX network, UltraWideband network, personal area network or other wireless access network, a broadcast satellite network and/or another communications network.

In various embodiments, the access terminal 112 can include a digital subscriber line access multiplexer (DSLAM), cable modem termination system (CMTS), optical line terminal (OLT) and/or other access terminal. The data terminals 114 can include personal computers, laptop computers, netbook computers, tablets or other computing devices along with digital subscriber line (DSL) modems, data over coax service interface specification (DOCSIS) modems or other cable modems, a wireless modem such as a 4G, 5G, or higher generation modem, an optical modem and/or other access devices.

In various embodiments, the base station or access point 122 can include a 4G, 5G, or higher generation base station, an access point that operates via an 802.11 standard such as 802.11n, 802.11ac or other wireless access terminal. The mobile devices 124 can include mobile phones, e-readers, tablets, phablets, wireless modems, and/or other mobile computing devices.

In various embodiments, the switching device 132 can include a private branch exchange or central office switch, a media services gateway, VoIP gateway or other gateway device and/or other switching device. The telephony devices 134 can include traditional telephones (with or without a terminal adapter), VoIP telephones and/or other telephony devices.

In various embodiments, the media terminal 142 can include a cable head-end or other TV head-end, a satellite receiver, gateway or other media terminal 142. The display devices 144 can include televisions with or without a set top box, personal computers and/or other display devices.

In various embodiments, the content sources 175 include broadcast television and radio sources, video on demand platforms and streaming video and audio services platforms, one or more content data networks, data servers, web servers and other content servers, and/or other sources of media.

In various embodiments, the communications network 125 can include wired, optical and/or wireless links and the network elements 150, 152, 154, 156, etc. can include service switching points, signal transfer points, service control points, network gateways, media distribution hubs, servers, firewalls, routers, edge devices, switches and other network nodes for routing and controlling communications traffic over wired, optical and wireless links as part of the Internet and other public networks as well as one or more private networks, for managing subscriber access, for billing and network management and for supporting other network functions.

Figure 1B:
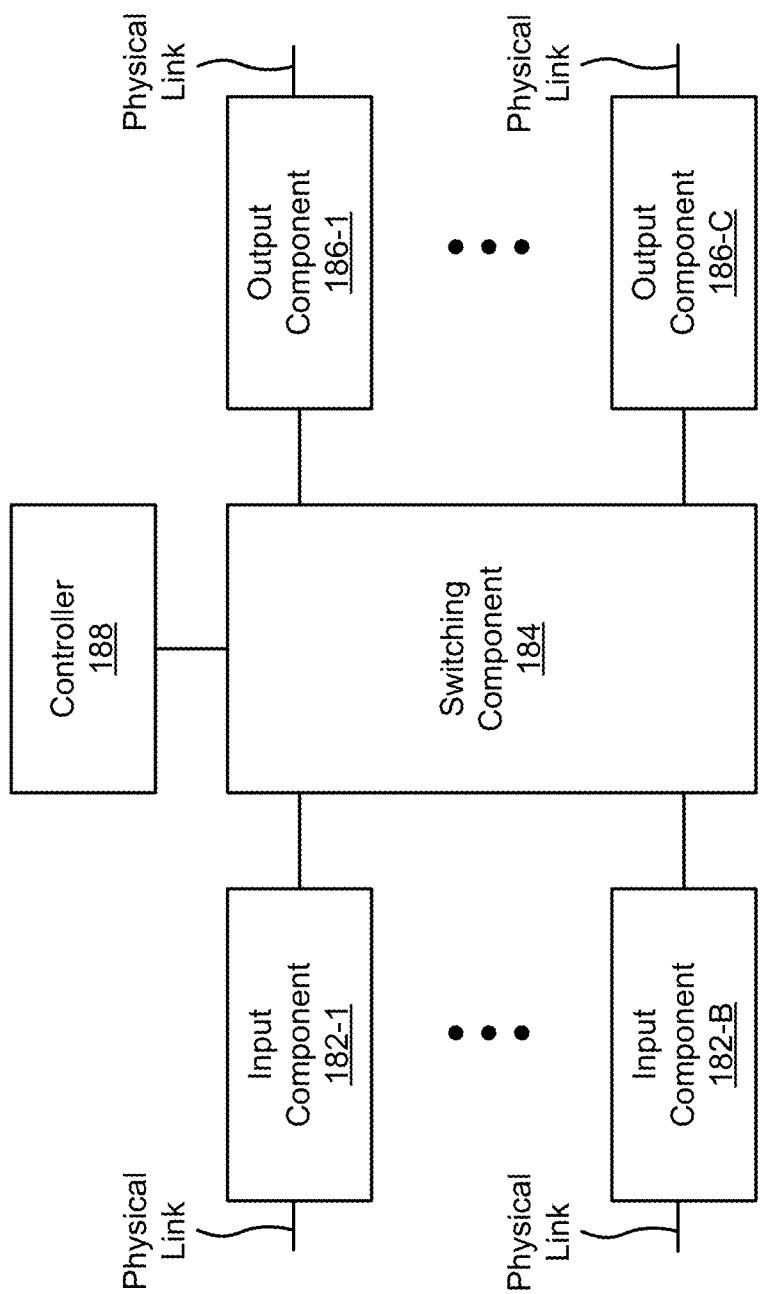
FIG. 1B is a diagram of example components of one or more devices of the system of FIG. 1A in accordance with various aspects described herein.

FIG. 1B is a diagram of example components of a device 180. The device 180 may correspond to one or more devices of the system 100 of FIG. 1A. In some embodiments, one or more devices of the system 100 of FIG. 1A may include one or more devices 180 and/or one or more components of the device 180. As shown in FIG. 1B, the device 180 may include one or more input components 182-1 through 182-B (B≥1) (hereinafter referred to collectively as "input components 182," and individually as "input component 182"), a switching component 184, one or more output components 186-1 through 186-C (C≥1) (hereinafter referred to collectively as "output components 186," and individually as "output component 186"), and a controller 188.

In various embodiments, the input component 182 may be points of attachment for physical links and may be points of entry for incoming traffic, such as packets. The input component 182 may process incoming traffic, such as by performing data link layer encapsulation or decapsulation. In some embodiments, the input component 182 may send and/or receive packets. In some embodiments, the input component 182 may include an input line card that includes one or more packet processing components (e.g., in the form of integrated circuits), such as one or more interface cards (IFCs), packet forwarding components, line card controller components, input ports, processors, memories, and/or input queues. In some embodiments, the device 180 may include one or more input components 182.

The switching component 184 may interconnect the input components 182 with the output components 186. In some embodiments, the switching component 184 may be implemented via one or more crossbars, via busses, and/or with shared memories. The shared memories may act as temporary buffers to store packets from the input components 182 before the packets are eventually scheduled for delivery to the output components 186. In some embodiments, the switching component 184 may enable the input components 182, the output components 186, and/or the controller 188 to communicate with one another.

The output component 186 may store packets and may schedule packets for transmission on output physical links. The output component 186 may support data link layer encapsulation or decapsulation and/or a variety of higher-level protocols. In some embodiments, the output component 186 may send packets and/or receive packets. In some embodiments, the output component 186 may include an output line card that includes one or more packet processing components (e.g., in the form of integrated circuits), such as one or more IFCs, packet forwarding components, line card controller components, output ports, processors, memories, and/or output queues. In some embodiments, the device 180 may include one or more output components 186. In some embodiments, input component 182 and output component 186 may be implemented by the same set of components (e.g., an input/output component may be a combination of input component 182 and output component 186).

The controller 188 may include a processor in the form of, for example, a central processing unit (CPU), a graphics processing unit (GPU), an accelerated processing unit (APU), a microprocessor, a microcontroller, a digital signal processor (DSP), a field-programmable gate array (FPGA), an ASIC, and/or another type of processor that can interpret and/or execute instructions. A processor is implemented in hardware, firmware, or a combination of hardware and software. In some embodiments, the controller 188 may include one or more processors that can be programmed to perform a function.

In some embodiments, the controller 188 may include a random access memory (RAM), a read only memory (ROM), and/or another type of dynamic or static storage device (e.g., a flash memory, a magnetic memory, or an optical memory) that stores information and/or instructions for use by the controller 188.

In some embodiments, the controller 188 may communicate with other devices, networks, and/or systems connected to the device 180 to exchange information regarding network topology. The controller 188 may create routing tables based on the network topology information, create forwarding tables based on the routing tables, and forward the forwarding tables to the input components 182 and/or the output components 186. The input components 182 and/or the output components 186 may use the forwarding tables to perform route lookups for incoming and/or outgoing packets.

The controller 188 may perform one or more processes described herein. The controller 188 may perform these processes in response to executing software instructions stored by a non-transitory computer-readable medium. A memory device includes memory space within a single physical storage device or memory space spread across multiple physical storage devices.

Software instructions may be read into a memory and/or storage component associated with the controller 188 from another computer-readable medium or from another device via a communication interface. When executed, software instructions stored in a memory and/or storage component associated with the controller 188 may cause controller 188 to perform one or more processes described herein. Additionally, or alternatively, hardwired circuitry may be used in place of or in combination with software instructions to perform one or more processes described herein. Thus, embodiments described herein are not limited to any specific combination of hardware circuitry and software.

The number and arrangement of components shown in FIG. 1B are provided as an example. In practice, the device 180 may include additional components, fewer components, different components, or differently arranged components than those shown in FIG. 1B. Additionally, or alternatively, a set of components (e.g., one or more components) of the device 180 may perform one or more functions described as being performed by another set of components of the device 180.

Figure 2A:
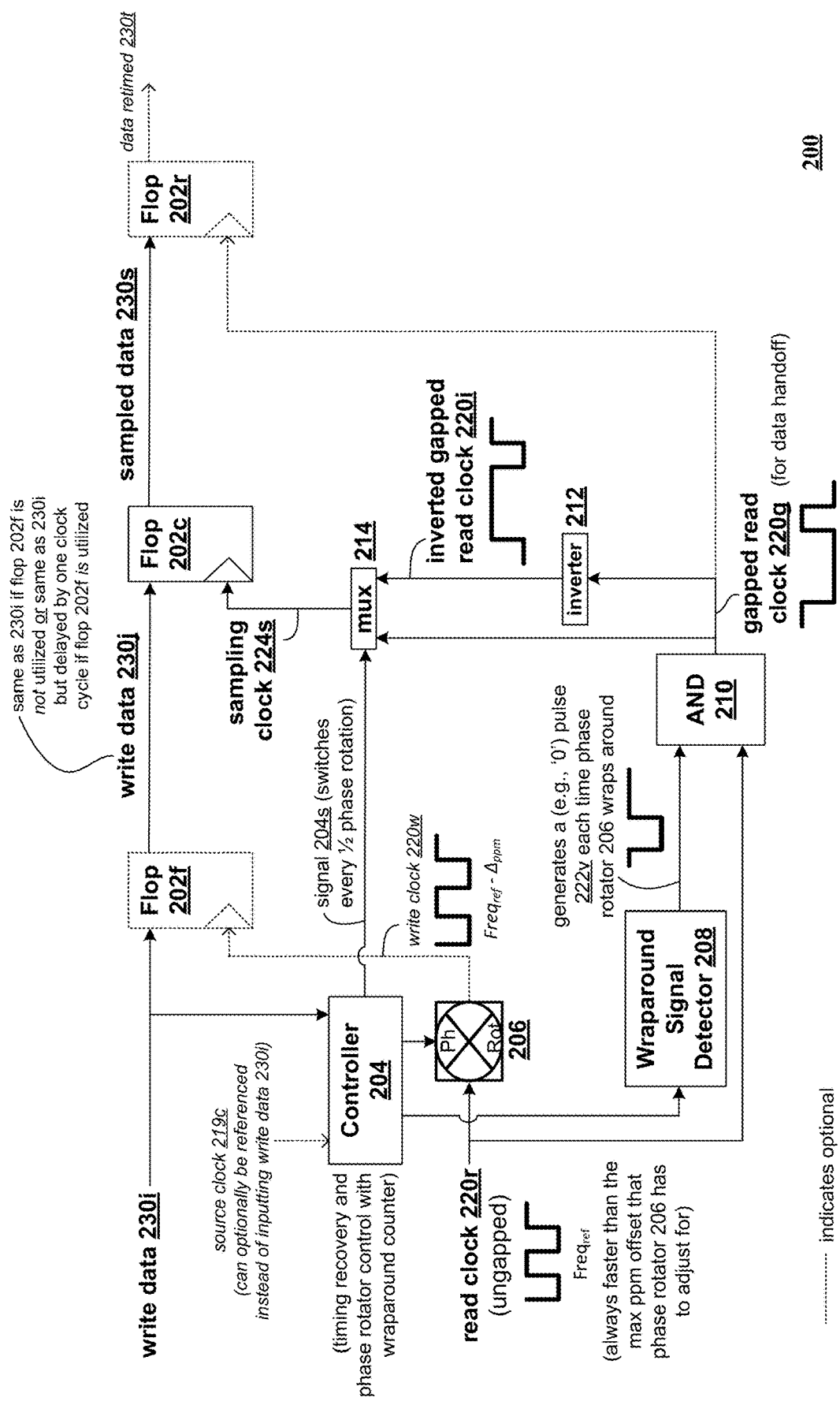
FIG. 2A is a diagram illustrating an example, non-limiting embodiment of a circuit system functioning within, or overlaid upon, the communications network of FIG. 1A and/or one or more components of the device of FIG. 1B in accordance with various aspects described herein.
Figure 2B:
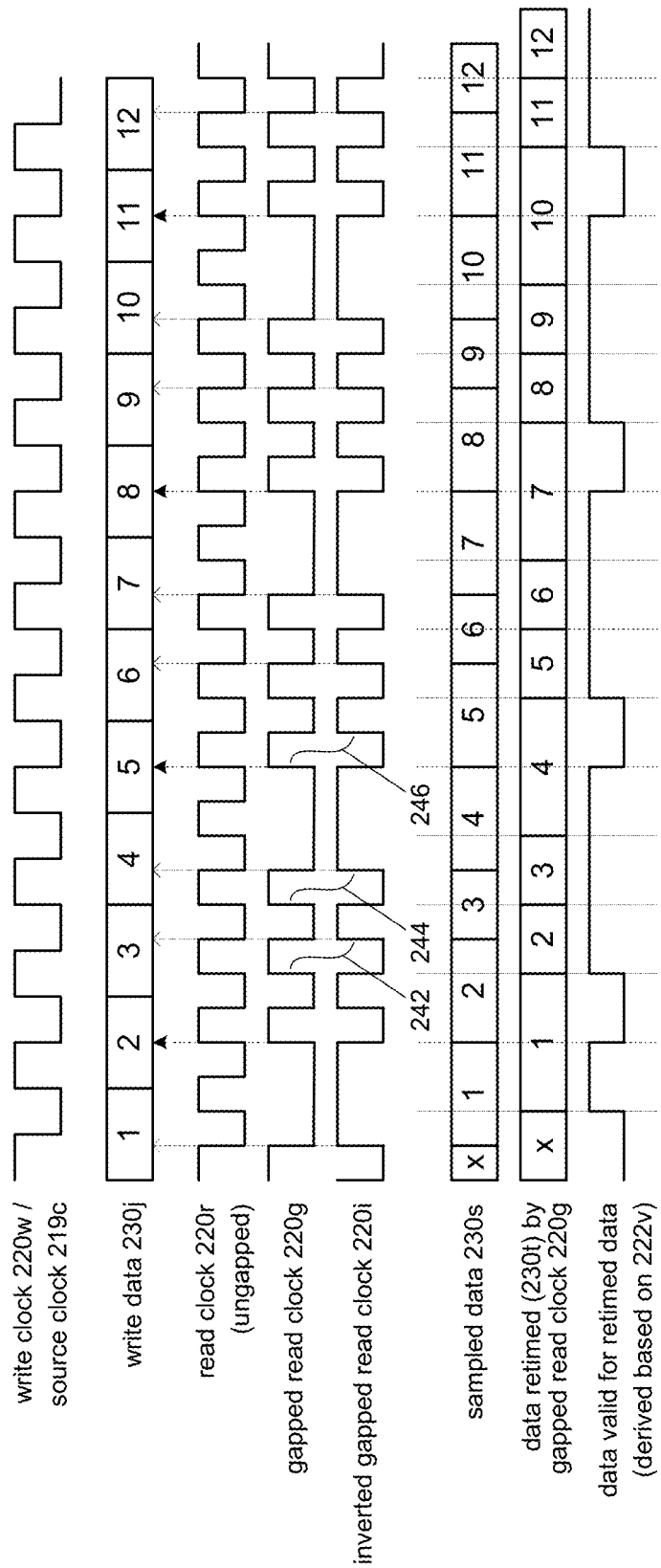
FIG. 2B is a diagram illustrating example waveforms and data read timing associated with the circuit system of FIG. 2A in accordance with various aspects described herein.

FIG. 2A is a diagram illustrating an example, non-limiting embodiment of a circuit system 200 functioning within, or overlaid upon, the communications network 100 of FIG. 1A and/or one or more components of the device 180 of FIG. 1B in accordance with various aspects described herein. FIG. 2B is a diagram illustrating example waveforms and data read timing associated with the circuit system 200 of FIG. 2A in accordance with various aspects described herein.

The circuit system 200 may include a sampling device configured to sample incoming data streams. The sampling device may be, or may include, a flip flop, such as a flip flop 202c depicted in FIG. 2A. As shown, the circuit system 200 may include a controller 204, a phase rotator 206, a wraparound signal detector 208, a logical AND gate 210, an inverter 212, and a multiplexor 214. The circuit system 200 may also optionally include one or more other sampling devices—e.g., a flip flop 202f and/or a flip flop 202r (described in more detail below).

A clocking structure of the circuit system 200 may include a (e.g., core ASIC) read clock 220r, a gapped read clock 220g, and an inversion of the gapped read clock 220g—i.e., an inverted gapped read clock 220i. As described in more detail below, the multiplexor 214 may be controlled to switch between selection/output of the gapped read clock 220g and the inverted gapped read clock 220i to create a sampling clock 224s for the flip flop 202c. In various embodiments, operation of the flip flop 202c may be in accordance with a rising edge of the sampling clock 224s. In other embodiments, operation of the flip flop 202c may alternatively be in accordance with a falling edge of the sampling clock 224s.

As depicted in FIG. 2A, the circuit system 200 may receive write data 230i from an upstream system (not shown). The write data 230i may be received according to a source clock 219c at a particular frequency in the upstream system's own clock domain. All of the read domain clocks—i.e., read clock 220r, gapped read clock 220g, and inverted gapped read clock 220i—may be synchronous to one another, but asynchronous to the source clock 219c.

To properly sample the write data 230i (or more particularly, write data 230j as shown in FIG. 2A) at the clock domain of the circuit system 200, the read clock 220r needs to be faster than the source clock 219c. As an example, assume that there is only a single stream of incoming write data 230i to be handed off. While the source clock 219c for that write data 230i might operate at a nominal frequency (e.g., 100 gigahertz (GHz) Ethernet speed), there will generally be a frequency error/offset or a degree to which the actual frequency deviates from the nominal frequency. For instance, where the frequency offset is 100 ppm, the potential offset in frequency may be 10 megahertz (MHz). Thus, the read clock 220r (from which the sampling clock 224s is derived) must generally be faster than the fastest possible speed of the source clock 219c (taking into consideration the source clock 219c's frequency error/offset) in order for the circuit system 200 to properly sample the write data 230i with no data loss. In a case where there are multiple streams of incoming write data—i.e., from multiple, independent upstream systems each operating at a slightly different source clock frequency—to be handed off to a common clock domain of the circuit system 200, the read clock 220r (from which each respective sampling clock for the multiple streams is to be derived) must generally be faster than the fastest possible speed out of all of the various source clocks (taking into consideration the largest of all of their frequency errors/offsets) in order for the circuit system 200 to properly sample all of the multiple streams with no data loss.

Furthermore, to properly sample the write data 230j at the clock domain of the circuit system 200, there needs to be sufficient timing margin between the transition of the write data 230j (i.e., information-carrying level transitions) and a sampling clock edge (e.g., here, a time period that exceeds a set up and hold time associated with the flip flop 202c). As with any set of asynchronous clocks, the transition of the write data 230j and the sampling clock edge will drift with respect to one another, and the gap between that transition and the sampling clock edge will occasionally become too small to provide the necessary timing margin. Thus, in exemplary embodiments, the controller 204 may operate in conjunction with the phase rotator 206 and the multiplexor 214 to provide proper sampling of the write data 230i with sufficient timing margins. In one or more embodiments, the controller 204 may control (or interact with) the phase rotator 206 and the multiplexor 214 to provide a sufficient relative offset (e.g., greater than or equal to a threshold value) between the edges of the source clock 219c and the sampling clock 224s. In various embodiments, the controller 204 may track the source clock 219c (by tracking the source clock 219c directly or by recovering the source clock 219c through monitoring of the write data 230i and tracking of the recovered clock), and control (or interact with) the phase rotator 206 and the wraparound signal detector 208 to provide frequency matching between the sampling clock 224s and the source clock 219c.

In exemplary embodiments, frequency matching between the sampling clock 224s and the source clock 219c may be achieved via clock gappings, where certain cycles or edges of a clock are completely skipped. As an example, if a first clock has one hundred edges per second and a second clock has ninety-eight edges per second, the skipping or elimination of two edges per second in the first clock yields a frequency match between the first clock and the second clock over that one second period in time. In various embodiments, the controller 204 and/or the phase rotator 206 may track a difference between the source clock 219c and the read clock 220r and "insert" gaps in the read clock 220r such that there is a frequency match between the two clocks. In one or more embodiments, the phase rotator 206 may be a DPC that performs continuous rotations about a a circle and that utilizes the write data 230i to identify or track the source clock 219c.

As shown in FIG. 2A, the phase rotator 206 may optionally generate/reproduce a local write clock 220w (based on the rotations) that mimics or exactly matches the source clock 219c. In one or more embodiments, the controller 204 may provide timing recovery by controlling the phase rotator 206 to restrict the speed of the output clock—i.e., the write clock 220w—relative to the read clock 220r such that the write clock 220w matches the source clock 219c. As also depicted in FIG. 2A, the controller 204 may optionally receive the source clock 219c as a reference in addition, or as an alternative, to receiving the write data 230i (see the optional source clock reference input of the controller 204 in FIG. 2A).

In one or more embodiments, the controller 204 may receive and analyze the write data 230i to detect the frequency of its information-carrying level transitions, which would be indicative of the frequency of the source clock 219c. In various embodiments, the controller 204 may, based on the frequency of the transitions, cause a digital PLL (not shown) to generate n phases for the read clock 220r, where each of the n phases corresponds to a shift in phase of the read clock 220r by a particular amount. For instance, the span of n phases may be mapped to degrees of a a circle, where the $0^{th}$ phase may correspond to 0 degrees of phase rotation (i.e., no phase shift), the $(n/2)^{th}$ phase may correspond to 180 degrees of phase rotation, the $n^{th}$ phase may correspond to 360 degrees of phase rotation, etc. In one or more embodiments, these phases may be inputted to the phase rotator 206 in a circular manner, where the phase subsequent to the $n^{th}$ phase may loop back to the $0^{th}$ phase, which allows the phase rotator 206 to output a continuous variation of the phase of the read clock 220r (or phase ramp) and thus generate a write clock 220w having a frequency offset $\Delta_{ppm}$ relative to the read clock 220r.

In various embodiments, the controller 204 may identify wraparounds of the phase rotator 206 based on tracking of the source clock 219c (e.g., from identified information-carrying level transitions in the write data 230i or, if available, from a reference of the source clock 219c), and leverage the identified wraparounds to generate the gapped read clock 220g. In one or more embodiments, each of the aforementioned n phases may be associated with a code input (e.g., a binary code) for the phase rotator 206. As an example, 10-bit length codes, spanning binary values 0 to 1023, may be respectively mapped to the n phases. For instance, binary value '0' may correspond to the $0^{th}$ phase (or 0 degrees of phase rotation), binary value '512' may correspond to the $(n/2)^{th}$ phase (or 180 degrees of phase rotation), binary value '1023' may correspond to the $n^{th}$ phase (or 360 degrees of phase rotation), etc. Here, a transition from binary value '1023' to '1024' may correspond to a full a radian cross or, in other words, a full wraparound of the phase rotator 206. Here, the controller 204 may track the cycling of the 10-bit length codes inputted to the phase rotator 206 and cause the wraparound signal detector 208 to output a (e.g., '0') pulse 222v when a wraparound of the code (and thus a wraparound of the phase rotator 206) is detected. As shown in FIG. 2A, the logical AND gate 210 may output the gapped read clock 220g with gaps that correspond to the pulses 222v and whose frequency over time (in terms of cycles per a particular period of time) matches that of the source clock 219c.

As briefly described above, a sufficient relative offset (e.g., greater than or equal to a threshold value) is generally needed between the edges of the source clock 219c and the sampling clock 224s. Thus, despite having generated a gapped read clock 220g whose frequency "matches" that of the source clock 219c, the gapped read clock 220g, as generated, cannot simply be used to sample the write data 230j. This is because the read clock 220r (from which the gapped read clock 220g is derived) is nevertheless operating slightly faster than the source clock 219c and thus there is relative drifting between the gapped read clock 220g and the source clock 219c.

In exemplary embodiments, the aforementioned drifting issue may be resolved by calibrating the timing of the controller 204's switch control of the multiplexor 214. Doing so can maintain the phase or relationship between the edges of the source clock 219c and the sampling clock 224s at a sufficient (e.g., at greater than a threshold) distance from one another such that timing margins are increased (e.g., maximized) to allow for proper sampling of the write data 230j.

Figure 2C:
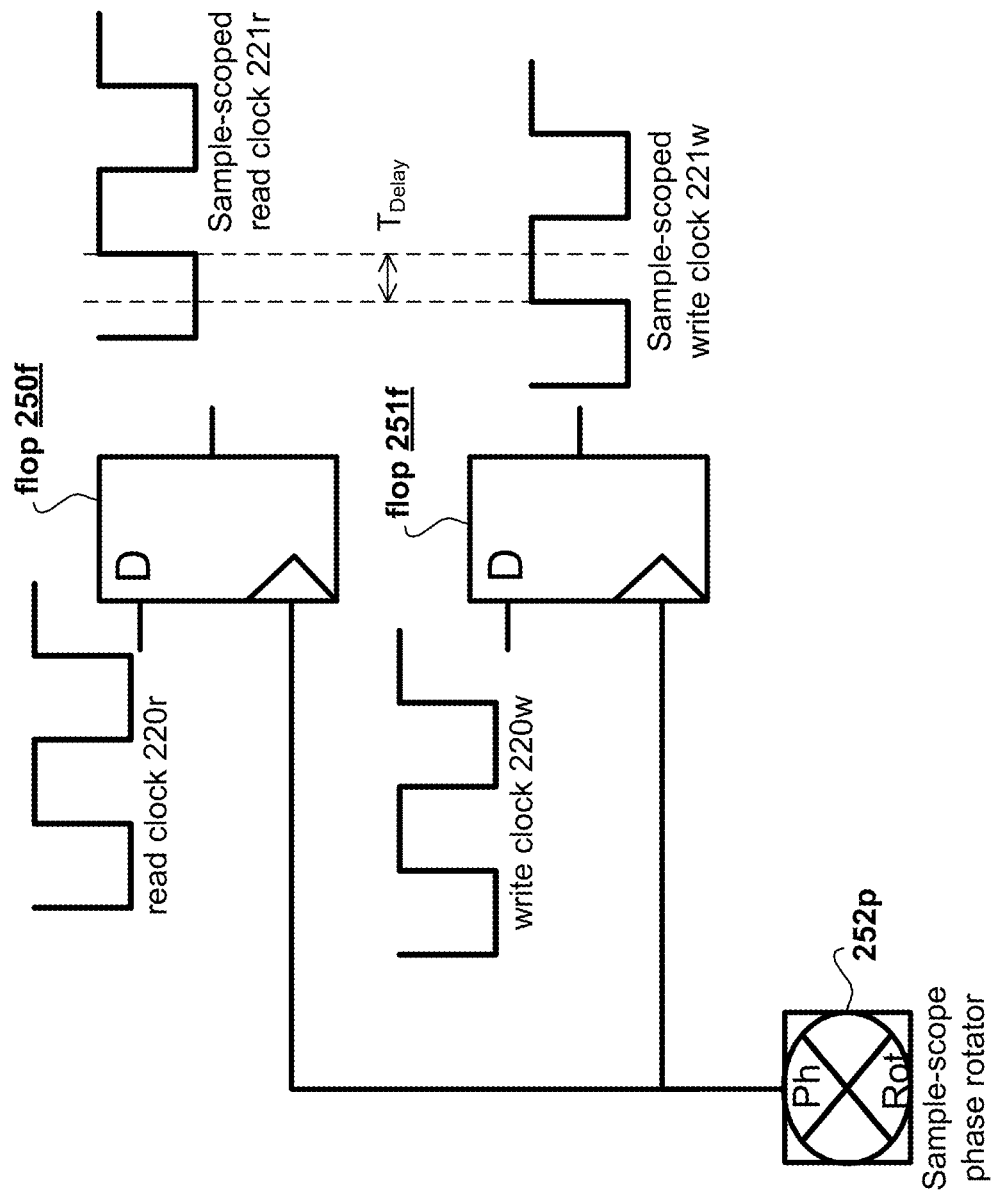
FIG. 2C is a diagram illustrating an example, non-limiting sample-scoping implementation in accordance with various aspects described herein.

In exemplary embodiments, calibration may be performed upon (or shortly after) startup or initialization of the circuit system 200. Here, the initial timing/phase relationship between the read clock 220r and the write clock 220w may be assessed—e.g., via sample-scoping or other like techniques. FIG. 2C is a diagram illustrating an example, non-limiting sample-scoping scheme in accordance with various aspects described herein. In one or more embodiments, the calibration scheme may be performed by a controller, such as the controller 204 of FIG. 2A and/or a different controller. As shown in FIG. 2C, a first flip flop 250f may receive the read clock 220r as input, a second flip flop 251f may receive the write clock 220w as input, and both flip flops 250f and 251f may operate based on an output of a sample-scope phase rotator 252p (which may correspond to the phase rotator 206 of FIG. 2A or may be a different phase rotator). As a result of sample-scoping, the flip flop 250f may output a sample-scoped read clock 221r and the flip flop 251f may output a sample-scoped write clock 221w, where a time delay or offset $T_{Delay}$ between edges (e.g., rising edges) of the two sample-scoped clocks 221r and 221w may be determined (and adjusted if needed).

In various embodiments, the value of $T_{Delay}$ may facilitate proper selection of the read clock 220e s edge (either a rising or falling edge—i.e., either the gapped read clock 220g or the inverted gapped read clock 220i) to utilize for sampling, such that there is an optimal (or improved) handoff between the write clock 220w and the sampling clock 224s (that is, such that timing margins are increased (e.g., maximized) during sampling of the write data 230j). In one or more embodiments, calibration of the controller 204 may be based on the observation that, for a given element of the write data 230*j*, either the rising edge of the gapped read clock 220*g* or the rising edge of the inverted gapped read clock 220*i* will be more optimal/desirable to use (e.g., will provide more timing margin) for sampling that data element. For instance, referring to reference number 242 of FIG. 2B, it can be seen that the rising edge of the inverted gapped read clock 220*i* may provide slightly more timing margin (i.e., more leeway for the flip flop 202*c* to set up and hold) than the rising edge of the gapped read clock 220*g*. As another example, referring to reference number 244 of FIG. 2B, it can be seen that the rising edge of the inverted gapped read clock 220*i* may also provide more timing margin than the rising edge of the gapped read clock 220*g*. In fact, here, the close proximity in time between that rising edge of the gapped read clock 220*g* and the transition in the write data 230*j* (between data elements '3' and '4') may even result in a set up and hold time violation. As yet another example, referring to reference number 246 of FIG. 2B, it can be seen that the rising edge of the gapped read clock 220*g* may provide more timing margin than the rising edge of the inverted gapped read clock 220*i*.

Thus, where the edges of the write clock 220*w* and the presently-used read clock (e.g., the gapped read clock 220*g*) are deemed "too close" (timing margin is less than a threshold), the sampling clock 224*s* can be switched to the other read clock (e.g., the inverted gapped read clock 220*i*) whose edge is not as close to the edge of the write clock 220*w*, so as to obtain a larger timing margin.

In one or more embodiments, a calibration offset value may be derived based on the value of $T_{Delay}$ and applied to the above-described code input for the phase rotator 206 for calibration purposes. For instance, referring to the above-described example of binary value '0' corresponding to a 0th phase (or 0 degrees of phase rotation), binary value '512' corresponding to the $(n/2)^{th}$ phase (or 180 degrees of phase rotation), and so on, the code input may be adjusted based on the calibration offset value, and an optimal/desirable clock edge (e.g., the rising edge of the gapped read clock 220*g* or the rising edge of the inverted gapped read clock 220*i*) may be determined for each rotational amount or section of the phase rotator 206. In so doing, switching signals 204*s* (of FIG. 2A)—for controlling the multiplexor 214's selection between the gapped read clock 220*g* and the inverted gapped read clock 220*i* as the sampling clock 224*s*—can be generated based on each half rotation of the phase rotator 206 (i.e., each 180 degree phase shift between the read clock 220*r* and the write clock 220*w*). In one or more embodiments, a current value of the code input to the phase rotator 206 may indicate whether a 180 degree phase shift has occurred. For instance, the signal 204*s* may be a '0' select signal (e.g., for selecting the gapped read clock 220*g*) when the code input to the phase rotator 206 is below a predefined value, and may be a '1' select signal (e.g., for selecting the inverted gapped read clock 220*i*) when the code input to the phase rotator 206 is greater than the predefined value. The rate of switching by the multiplexor 214 may therefore be dependent on a rate of spinning of the phase rotator 206.

Sampling of the write data 230*j* by alternating between the gapped read clock 220*g* and the inverted gapped read clock 220*i* each time the phase rotator 206 crosses 180 degrees of phase shift (or ½ of the period) ensures that proper handoff (or optimal/improved) timing will be preserved. That is, switching between the two inverted clocks every ½ rotation of the phase rotator ensures that there is sufficient timing margin (e.g., above a threshold timing margin) for each sampling of the write data 230*j*. In this way, the above-described calibration scheme may aid in identifying the timing of switches between the gapped clock 220*g* and the inverted gapped read clock 220*i*, such that the appropriate clock is selected for each rotational section of the phase rotator 206.

As illustrated in FIG. 2B, the circuit system 200 can selectively leverage the gapped read clock 220*g* and the inverted gapped read clock 220*i* to properly sample the write data 230*j* (i.e., as the sampled data 230*s*) with no data loss. The sampled data 230*s* can then be usable downstream on the read clock domain of the circuit system 200 (e.g., by pure digital logic), where the clock gapping may be carried forward as a "data valid" signal and the data may be obtained as retimed data 230*t* (see also FIG. 2A). In various embodiments, the data valid signal may be generated based on the clock gapping. For instance, every time the read clock 220*r* is gapped, the data valid may be '0' (not valid) since it is a repeat of the prior data, and every time the read clock 220*r* is not gapped, data valid may be '1' (valid) since it is new data. In a case where the gapped read clock 220*g* is utilized downstream, the data valid signal may or may not be needed because sampling downstream would only be on the gapped read clock edges. However, if there is a handoff downstream to an ungapped read clock, the data valid signal may be necessary in order to indicate which edges of the ungapped read clock are to be used for sampling and which edges are not to be used for sampling. Handing off to an ungapped clock using a data valid scheme, as described, is advantageous since one clock (rather than multiple gapped clocks) can be distributed throughout the device. In essence, the data valid scheme provides an additional or alternative method for performing clock gapping.

In various embodiments, the circuit system 200 may form a portion of an overall circuit system embedded in an ASIC that corresponds to, or that is included in, an input component 182, an output component 186, and/or the switching component 184 of FIG. 1B. As an example, the circuit system 200 may be implemented in an ASIC included in the switching component 184, and may be configured to perform low-latency, low-power asynchronous handoff associated with a given source of data that is communicated (e.g., over Ethernet) via an input component 182. Here, the data stream may propagate according to a, e.g., 100 GHz, clock at the upstream source, and may, by way of the circuit system 200, be handed off to a core read clock domain of the ASIC.

In one or more embodiments, multiple instances of certain components of the circuit system 200 (e.g., the phase rotator 206, the flip flop 202*c*, the multiplexor 214, the inverter 212, the wraparound signal detector 208, the logical AND gate 210, the flip flop 202*f*, and/or the flip flop 202*r*) may be embedded in one or more ASICs that correspond to, or that are included in, the switching component 184. In these embodiments, the multiple instances may be configured to perform low-latency, low-power asynchronous handoffs associated with multiple sources of data that are communicated (e.g., over Ethernet) via multiple input components 182. Here, each of the various data streams may propagate according to a, e.g., respective 100 GHz, clock at a corresponding upstream source, and may, by way of a corresponding instance of portion(s) of the circuit system 200, be handed off to a common core read clock domain of the ASIC. Thus, exemplary embodiments may facilitate data handoffs from multiple, different clock domains to a single, common clock domain. In one or more embodiments, a single controller 204 may control operations for all of the channels or multiple controllers 204 may each respectively control operations for a corresponding channel.

It is to be understood and appreciated that the above-described calibration scheme may also be performed in cases where there are multiple channels of incoming data. For instance, calibration can be performed for each write clock associated with each incoming data stream.

It is also to be understood and appreciated that the circuit system 200 and/or multiple instances of portion(s) of the circuit system 200 may be implemented for operation in other types of environments, and that the above-described examples are merely exemplary and not limiting. For instance, one skilled in the art would readily appreciate that the asynchronous handoff provided by the circuit system 200 may be implemented in any suitable environment involving data transfer/processing.

As briefly described above, and as shown in FIG. 2A, each of the flip flops 202$f$ and 202$r$ may be optional. In particular, the flip flop 202$f$ may simply represent an upstream system/component, where an operation of the flip flop 202$f$ by the write clock 220$w$ mimics an operation of the upstream system/component by the source clock 219$c$. Thus, in a case where the flip flop 202$f$ is not included in the circuit system 200, the write data 230$i$ may be inputted directly (as write data 230$j$ shown in FIG. 2A) into the flip flop 202$c$. Furthermore, the write clock 220$w$ can be directly used regardless of whether flip flop 202$f$ is included in the circuit system 200 or not. In various embodiments, where the flip flop 202$f$ is not included in the circuit system 200, the controller 204 may nevertheless cause the phase rotator 206 to generate the write clock 220$w$ for purposes of tracking the speed of rotation of the phase rotator 206. Here, the write clock 220$w$ may be inputted back to the controller 204 for the tracking.

The flip flop 202$r$ may simply represent a downstream system/component or destination that receives the sampled data 230$s$ via the asynchronous handoff provided by the flip flop 202$c$. Thus, in a case where the flip flop 202$r$ is not included in the circuit system 200, the sampled data 230$s$ may simply be provided to some destination logic for processing or subsequent forwarding.

It is to be understood and appreciated that the number and arrangement of components shown in each of FIGS. 2A and 2C are provided as an example. In practice, the circuit(s)/system(s) of FIGS. 2A and 2C may include additional components, fewer components, different components, or differently arranged components than those shown in FIGS. 2A and 2C. Additionally, or alternatively, a set of components (e.g., one or more components) of the circuit(s)/system (s) of FIGS. 2A and 2C may perform one or more functions described as being performed by another set of components of the circuit(s)/system(s).

It is also to be understood and appreciated that, although one or more of FIGS. 2A-2C are described above as pertaining to various processes and/or actions that are performed in a particular order, some of these processes and/or actions may occur in different orders and/or concurrently with other processes and/or actions from what is depicted and described above. Moreover, not all of these processes and/or actions may be required to implement the systems and/or methods described herein.

In one or more embodiments described herein, an improved circuit system can be utilized rather than or in addition to an optimal circuit system to provide desired low-latency, low-power data handoff between asynchronous clock domains.

Figure 2D:
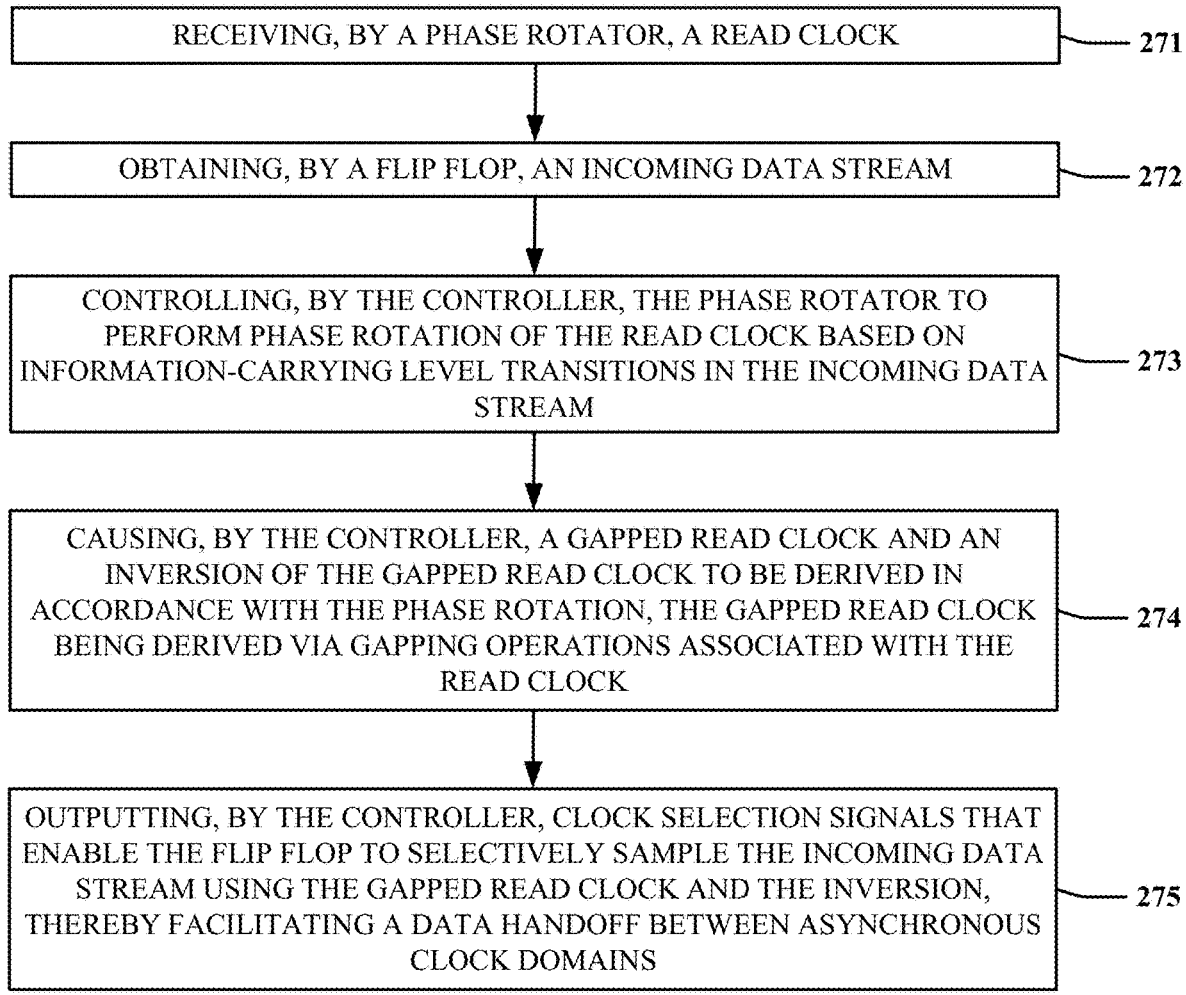
FIG. 2D depicts an illustrative embodiment of a method in accordance with various aspects described herein.

FIG. 2D depicts an illustrative embodiment of a method 270 in accordance with various aspects described herein.

At 271, the method can include receiving, by a phase rotator, a read clock. For example, a phase rotator can receive a read clock, similar to that described above with respect to the system 200 of FIG. 2A.

At 272, the method can include obtaining, by a flip flop, an incoming data stream. For example, a flip flop can obtain an incoming data stream, similar to that described above with respect to the system 200 of FIG. 2A.

At 273, the method can include controlling, by the controller, the phase rotator to perform phase rotation of the read clock based on information-carrying level transitions in the incoming data stream. For example, the controller can control the phase rotator to perform phase rotation of the read clock based on information-carrying level transitions in the incoming data stream, similar to that described above with respect to the system 200 of FIG. 2A.

At 274, the method can include causing, by the controller, a gapped read clock and an inversion of the gapped read clock to be derived in accordance with the phase rotation, the gapped read clock being derived via gapping operations associated with the read clock. For example, the controller can cause a gapped read clock and an inversion of the gapped read clock to be derived in accordance with the phase rotation, where the gapped read clock is derived via gapping operations associated with the read clock, similar to that described above with respect to the system 200 of FIG. 2A.

At 275, the method can include outputting, by the controller, clock selection signals that enable the flip flop to selectively sample the incoming data stream using the gapped read clock and the inversion, thereby facilitating a data handoff between asynchronous clock domains. For example, the controller can output clock selection signals that enable the flip flop to selectively sample the incoming data stream using the gapped read clock and the inversion, thereby facilitating a data handoff between asynchronous clock domains, similar to that described above with respect to the system 200 of FIG. 2A.

In some implementations, the clock selection signals provide for phase relationships between sampling clock edges at the flip flop and transitions in the incoming data stream that satisfy a timing margin requirement.

In some implementations, the phase rotator or the controller is further configured to output wraparound signals indicative of wraparounds of the phase rotator, where a wraparound signal detector is configured to generate pulses based on the wraparound signals, and one or more logical components are configured to output the gapped read clock in accordance with the pulses.

In some implementations, an inverter receives the gapped read clock and outputs the inversion, where use of the inversion for selective sampling of the incoming data stream enables a timing margin requirement to be satisfied.

In some implementations, a multiplexor has an output coupled to the flip flop, and is configured to receive the clock selection signals, the gapped read clock, and the inversion, and selectively output, to the flip flop, the gapped read clock and the inversion based on the clock selection signals.

In some implementations, the phase rotator is further configured to generate a write clock based on the phase rotation. In some implementations, a first additional flip flop operates based on the write clock and/or a second additional flip flop operates based on the gapped read clock. In some implementations, the controller is further configured to perform calibration based on an identified phase difference between the read clock and the write clock.

In some implementations, the read clock is faster than an expected frequency of the transitions by a predefined number of parts per million (ppm).

In some implementations, the clock selection signals switch every half rotation of the phase rotator.

In some implementations, an additional flip flop is configured to obtain an additional incoming data stream, an additional phase rotator is configured to receive the read clock, and the controller is further configured to output additional clock selection signals that enable the additional flip flop to selectively sample the additional incoming data stream using an additional gapped read clock and an inversion of the additional gapped read clock, where outputs of the flip flop and the additional flip flop may be provided to a common clock domain.

In some implementations, the controller is further configured to receive a source clock associated with the incoming data stream, where the transitions are identified based on the source clock.

While for purposes of simplicity of explanation, the respective processes are shown and described as a series of blocks in FIG. 2D, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Referring now to FIG. 3, a block diagram 300 is shown illustrating an example, non-limiting embodiment of a virtualized communications network in accordance with various aspects described herein. In particular, a virtualized communications network is presented that can be used to implement some or all of the subsystems and functions of system 100, the subsystems and functions of the device 180, the subsystems and functions of system 200, the subsystems and functions of system 250, and/or method 270 presented in FIGS. 1A, 1B, 2A, 2C, and 2D. For example, virtualized communications network 300 can facilitate, in whole or in part, low-latency, low-power data handoff between two asynchronous clock domains as described herein with respect to one or more of FIGS. 2A-2D.

In particular, a cloud networking architecture is shown that leverages cloud technologies and supports rapid innovation and scalability via a transport layer 350, a virtualized network function cloud 325 and/or one or more cloud computing environments 375. In various embodiments, this cloud networking architecture is an open architecture that leverages application programming interfaces (APIs); reduces complexity from services and operations; supports more nimble business models; and rapidly and seamlessly scales to meet evolving customer requirements including traffic growth, diversity of traffic types, and diversity of performance and reliability expectations.

In contrast to traditional network elements—which are typically integrated to perform a single function, the virtualized communications network employs virtual network elements (VNEs) 330, 332, 334, etc. that perform some or all of the functions of network elements 150, 152, 154, 156, etc. For example, the network architecture can provide a substrate of networking capability, often called Network Function Virtualization Infrastructure (NFVI) or simply infrastructure that is capable of being directed with software and Software Defined Networking (SDN) protocols to perform a broad variety of network functions and services. This infrastructure can include several types of substrates. The most typical type of substrate being servers that support Network Function Virtualization (NFV), followed by packet forwarding capabilities based on generic computing resources, with specialized network technologies brought to bear when general-purpose processors or general-purpose integrated circuit devices offered by merchants (referred to herein as merchant silicon) are not appropriate. In this case, communication services can be implemented as cloud-centric workloads.

As an example, a traditional network element 150 (shown in FIG. 1A), such as an edge router can be implemented via a VNE 330 composed of NFV software modules, merchant silicon, and associated controllers. The software can be written so that increasing workload consumes incremental resources from a common resource pool, and moreover so that it is elastic: so, the resources are only consumed when needed. In a similar fashion, other network elements such as other routers, switches, edge caches, and middle-boxes are instantiated from the common resource pool. Such sharing of infrastructure across a broad set of uses makes planning and growing infrastructure easier to manage.

In an embodiment, the transport layer 350 includes fiber, cable, wired and/or wireless transport elements, network elements and interfaces to provide broadband access 110, wireless access 120, voice access 130, media access 140 and/or access to content sources 175 for distribution of content to any or all of the access technologies. In particular, in some cases a network element needs to be positioned at a specific place, and this allows for less sharing of common infrastructure. Other times, the network elements have specific physical layer adapters that cannot be abstracted or virtualized, and might require special DSP code and analog front-ends (AFEs) that do not lend themselves to implementation as VNEs 330, 332 or 334. These network elements can be included in transport layer 350.

The virtualized network function cloud 325 interfaces with the transport layer 350 to provide the VNEs 330, 332, 334, etc. to provide specific NFVs. In particular, the virtualized network function cloud 325 leverages cloud operations, applications, and architectures to support networking workloads. The virtualized network elements 330, 332 and 334 can employ network function software that provides either a one-for-one mapping of traditional network element function or alternately some combination of network functions designed for cloud computing. For example, VNEs 330, 332 and 334 can include route reflectors, domain name system (DNS) servers, and dynamic host configuration protocol (DHCP) servers, system architecture evolution (SAE) and/or mobility management entity (MME) gateways, broadband network gateways, IP edge routers for IP-VPN, Ethernet and other services, load balancers, distributers and other network elements. Because these elements do not typically need to forward substantial amounts of traffic, their workload can be distributed across a number of servers—each of which adds a portion of the capability, and which creates an overall elastic function with higher availability than its former monolithic version. These virtual network elements 330, 332, 334, etc. can be instantiated and managed using an orchestration approach similar to those used in cloud compute services.

The cloud computing environments 375 can interface with the virtualized network function cloud 325 via APIs that expose functional capabilities of the VNEs 330, 332, 334, etc. to provide the flexible and expanded capabilities to the virtualized network function cloud 325. In particular, network workloads may have applications distributed across the virtualized network function cloud 325 and cloud computing environment 375 and in the commercial cloud, or might simply orchestrate workloads supported entirely in NFV infrastructure from these third party locations.

Figure 4:
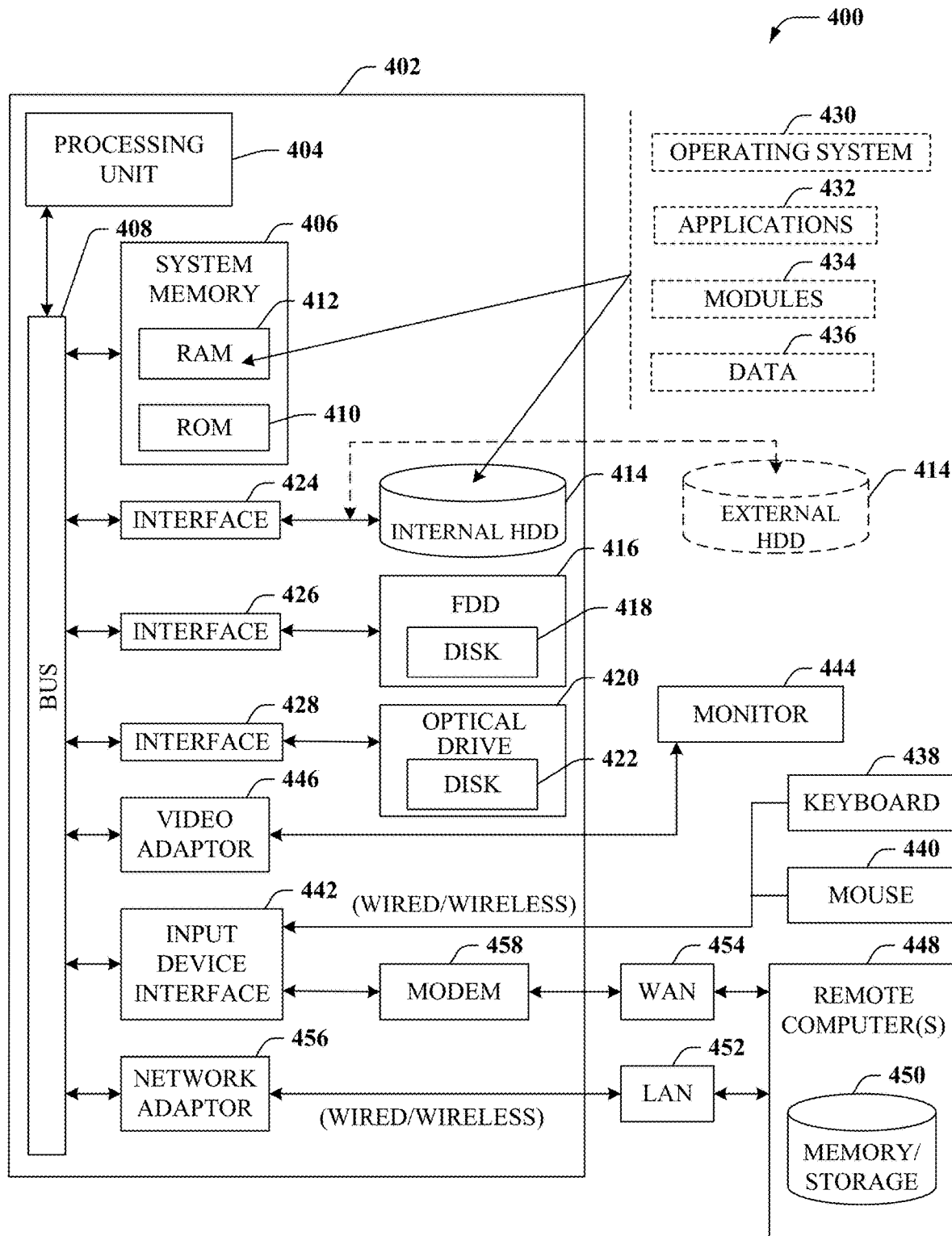
FIG. 4 is a block diagram of an example, non-limiting embodiment of a computing environment in accordance with various aspects described herein.

Turning now to FIG. 4, there is illustrated a block diagram of a computing environment in accordance with various aspects described herein. In order to provide additional context for various embodiments of the embodiments described herein, FIG. 4 and the following discussion are intended to provide a brief, general description of a suitable computing environment 400 in which the various embodiments of the subject disclosure can be implemented. In particular, computing environment 400 can be used in the implementation of network elements 150, 152, 154, 156, access terminal 112, base station or access point 122, switching device 132, media terminal 142, and/or VNEs 330, 332, 334, etc. Each of these devices can be implemented via computer-executable instructions that can run on one or more computers, and/or in combination with other program modules and/or as a combination of hardware and software. For example, computing environment 400 can facilitate, in whole or in part, low-latency, low-power data handoff between two asynchronous clock domains as described herein with respect to one or more of FIGS. 2A-2D.

Generally, program modules comprise routines, programs, components, data structures, etc., that perform particular tasks or implement particular abstract data types. Moreover, those skilled in the art will appreciate that the methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 4, the example environment can comprise a computer 402, the computer 402 comprising a processing unit 404, a system memory 406 and a system bus 408. The system bus 408 couples system components including, but not limited to, the system memory 406 to the processing unit 404. The processing unit 404 can be any of various commercially available processors. Dual microprocessors and other multiprocessor architectures can also be employed as the processing unit 404.

The system bus 408 can be any of several types of bus structure that can further interconnect to a memory bus (with or without a memory controller), a peripheral bus, and a local bus using any of a variety of commercially available bus architectures. The system memory 406 comprises ROM 410 and RAM 412. A basic input/output system (BIOS) can be stored in a non-volatile memory such as ROM, erasable programmable read only memory (EPROM), EEPROM, which BIOS contains the basic routines that help to transfer information between elements within the computer 402, such as during startup. The RAM 412 can also comprise a high-speed RAM such as static RAM for caching data.

The computer 402 further comprises an internal hard disk drive (HDD) 414 (e.g., EIDE, SATA), which internal HDD 414 can also be configured for external use in a suitable chassis (not shown), a magnetic floppy disk drive (FDD) 416, (e.g., to read from or write to a removable diskette 418) and an optical disk drive 420, (e.g., reading a CD-ROM disk 422 or, to read from or write to other high capacity optical media such as the DVD). The HDD 414, magnetic FDD 416 and optical disk drive 420 can be connected to the system bus 408 by a hard disk drive interface 424, a magnetic disk drive interface 426 and an optical drive interface 428, respectively. The hard disk drive interface 424 for external drive implementations comprises at least one or both of Universal Serial Bus (USB) and Institute of Electrical and Electronics Engineers (IEEE) 1394 interface technologies.

Other external drive connection technologies are within contemplation of the embodiments described herein.

The drives and their associated computer-readable storage media provide nonvolatile storage of data, data structures, computer-executable instructions, and so forth. For the computer 402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 412, comprising an operating system 430, one or more application programs 432, other program modules 434 and program data 436. All or portions of the operating system, applications, modules, and/or data can also be cached in the RAM 412. The systems and methods described herein can be implemented utilizing various commercially available operating systems or combinations of operating systems.

A user can enter commands and information into the computer 402 through one or more wired/wireless input devices, e.g., a keyboard 438 and a pointing device, such as a mouse 440. Other input devices (not shown) can comprise a microphone, an infrared (IR) remote control, a joystick, a game pad, a stylus pen, touch screen or the like. These and other input devices are often connected to the processing unit 404 through an input device interface 442 that can be coupled to the system bus 408, but can be connected by other interfaces, such as a parallel port, an IEEE 1394 serial port, a game port, a universal serial bus (USB) port, an IR interface, etc.

A monitor 444 or other type of display device can be also connected to the system bus 408 via an interface, such as a video adapter 446. It will also be appreciated that in alternative embodiments, a monitor 444 can also be any display device (e.g., another computer having a display, a smart phone, a tablet computer, etc.) for receiving display information associated with computer 402 via any communication means, including via the Internet and cloud-based networks. In addition to the monitor 444, a computer typically comprises other peripheral output devices (not shown), such as speakers, printers, etc.

The computer 402 can operate in a networked environment using logical connections via wired and/or wireless communications to one or more remote computers, such as a remote computer(s) 448. The remote computer(s) 448 can be a workstation, a server computer, a router, a personal computer, portable computer, microprocessor-based entertainment appliance, a peer device or other common network node, and typically comprises many or all of the elements described relative to the computer 402, although, for purposes of brevity, only a remote memory/storage device 450 is illustrated. The logical connections depicted comprise wired/wireless connectivity to a local area network (LAN) 452 and/or larger networks, e.g., a wide area network (WAN) 454. Such LAN and WAN networking environments are commonplace in offices and companies, and facilitate enterprise-wide computer networks, such as intranets, all of which can connect to a global communications network, e.g., the Internet.

When used in a LAN networking environment, the computer 402 can be connected to the LAN 452 through a wired and/or wireless communications network interface or adapter 456. The adapter 456 can facilitate wired or wireless communication to the LAN 452, which can also comprise a wireless AP disposed thereon for communicating with the adapter 456.

When used in a WAN networking environment, the computer 402 can comprise a modem 458 or can be connected to a communications server on the WAN 454 or has other means for establishing communications over the WAN 454, such as by way of the Internet. The modem 458, which can be internal or external and a wired or wireless device, can be connected to the system bus 408 via the input device interface 442. In a networked environment, program modules depicted relative to the computer 402 or portions thereof, can be stored in the remote memory/storage device 450. It will be appreciated that the network connections shown are example and other means of establishing a communications link between the computers can be used.

The computer 402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 5:
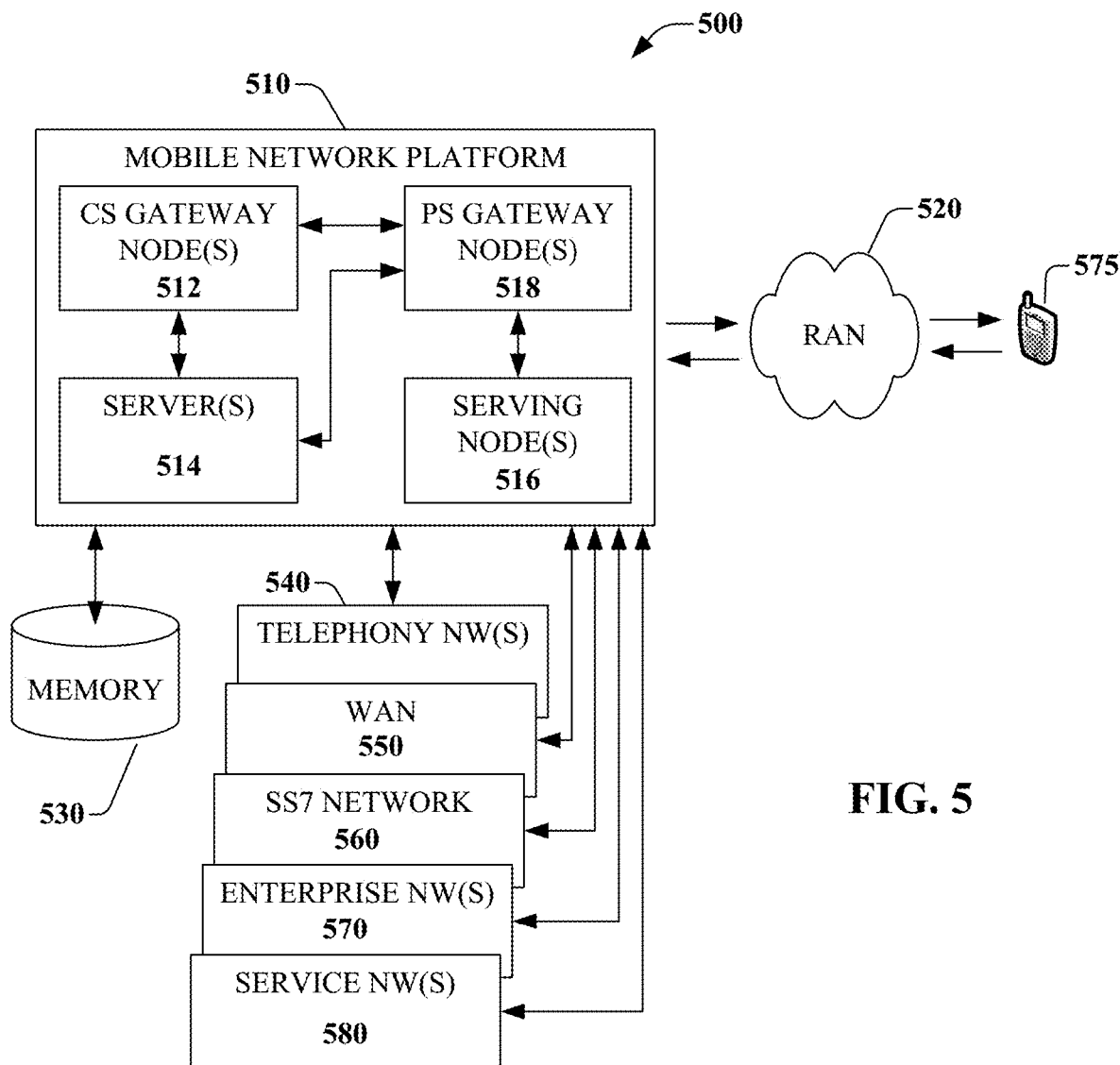
FIG. 5 is a block diagram of an example, non-limiting embodiment of a mobile network platform in accordance with various aspects described herein.

Turning now to FIG. 5, an embodiment 500 of a mobile network platform 510 is shown that is an example of network elements 150, 152, 154, 156, and/or VNEs 330, 332, 334, etc. For example, platform 510 can facilitate, in whole or in part, low-latency, low-power data handoff between two asynchronous clock domains as described herein with respect to one or more of FIGS. 2A-2D. In one or more embodiments, the mobile network platform 510 can generate and receive signals transmitted and received by base stations or access points such as base station or access point 122. Generally, mobile network platform 510 can comprise components, e.g., nodes, gateways, interfaces, servers, or disparate platforms, which facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, mobile network platform 510 can be included in telecommunications carrier networks, and can be considered carrier-side components as discussed elsewhere herein. Mobile network platform 510 comprises CS gateway node(s) 512 which can interface CS traffic received from legacy networks like telephony network(s) 540 (e.g., public switched telephone network (PSTN), or public land mobile network (PLMN)) or a signaling system #7 (SS7) network 560. CS gateway node(s) 512 can authorize and authenticate traffic (e.g., voice) arising from such networks. Additionally, CS gateway node(s) 512 can access mobility, or roaming, data generated through SS7 network 560; for instance, mobility data stored in a visited location register (VLR), which can reside in memory 530. Moreover, CS gateway node(s) 512 interfaces CS-based traffic and signaling and PS gateway node(s) 518. As an example, in a 3GPP UMTS network, CS gateway node(s) 512 can be realized at least in part in gateway GPRS support node(s) (GGSN). It should be appreciated that functionality and specific operation of CS gateway node(s) 512, PS gateway node(s) 518, and serving node(s) 516, is provided and dictated by radio technology (ies) utilized by mobile network platform 510 for telecommunication over a radio access network 520 with other devices, such as a radiotelephone 575.

In addition to receiving and processing CS-switched traffic and signaling, PS gateway node(s) 518 can authorize and authenticate PS-based data sessions with served mobile devices. Data sessions can comprise traffic, or content(s), exchanged with networks external to the mobile network platform 510, like wide area network(s) (WANs) 550, enterprise network(s) 570, and service network(s) 580, which can be embodied in local area network(s) (LANs), can also be interfaced with mobile network platform 510 through PS gateway node(s) 518. It is to be noted that WANs 550 and enterprise network(s) 570 can embody, at least in part, a service network(s) like IP multimedia subsystem (IMS). Based on radio technology layer(s) available in technology resource(s) or radio access network 520, PS gateway node(s) 518 can generate packet data protocol contexts when a data session is established; other data structures that facilitate routing of packetized data also can be generated. To that end, in an aspect, PS gateway node(s) 518 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 500, mobile network platform 510 also comprises serving node(s) 516 that, based upon available radio technology layer(s) within technology resource(s) in the radio access network 520, convey the various packetized flows of data streams received through PS gateway node(s) 518. It is to be noted that for technology resource(s) that rely primarily on CS communication, server node(s) can deliver traffic without reliance on PS gateway node(s) 518; for example, server node(s) can embody at least in part a mobile switching center. As an example, in a 3GPP UMTS network, serving node(s) 516 can be embodied in serving GPRS support node(s) (SGSN).

For radio technologies that exploit packetized communication, server(s) 514 in mobile network platform 510 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by mobile network platform 510. Data streams (e.g., content(s) that are part of a voice call or data session) can be conveyed to PS gateway node(s) 518 for authorization/authentication and initiation of a data session, and to serving node(s) 516 for communication thereafter. In addition to application server, server(s) 514 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through mobile network platform 510 to ensure network's operation and data integrity in addition to authorization and authentication procedures that CS gateway node(s) 512 and PS gateway node(s) 518 can enact. Moreover, provisioning server(s) can provision services from external network(s) like networks operated by a disparate service provider; for instance, WAN 550 or Global Positioning System (GPS) network(s) (not shown). Provisioning server(s) can also provision coverage through networks associated to mobile network platform 510 (e.g., deployed and operated by the same service provider), such as distributed antenna networks that enhance wireless service coverage by providing more network coverage.

It is to be noted that server(s) 514 can comprise one or more processors configured to confer at least in part the functionality of mobile network platform 510. To that end, the one or more processors can execute code instructions stored in memory 530, for example. It should be appreciated that server(s) 514 can comprise a content manager, which operates in substantially the same manner as described hereinbefore.

In example embodiment 500, memory 530 can store information related to operation of mobile network platform 510. Other operational information can comprise provisioning information of mobile devices served through mobile network platform 510, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 530 can also store information from at least one of telephony network(s) 540, WAN 550, SS7 network 560, or enterprise network(s) 570. In an aspect, memory 530 can be, for example, accessed as part of a data store component or as a remotely connected memory store.

In order to provide a context for the various aspects of the disclosed subject matter, FIG. 5, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 6:
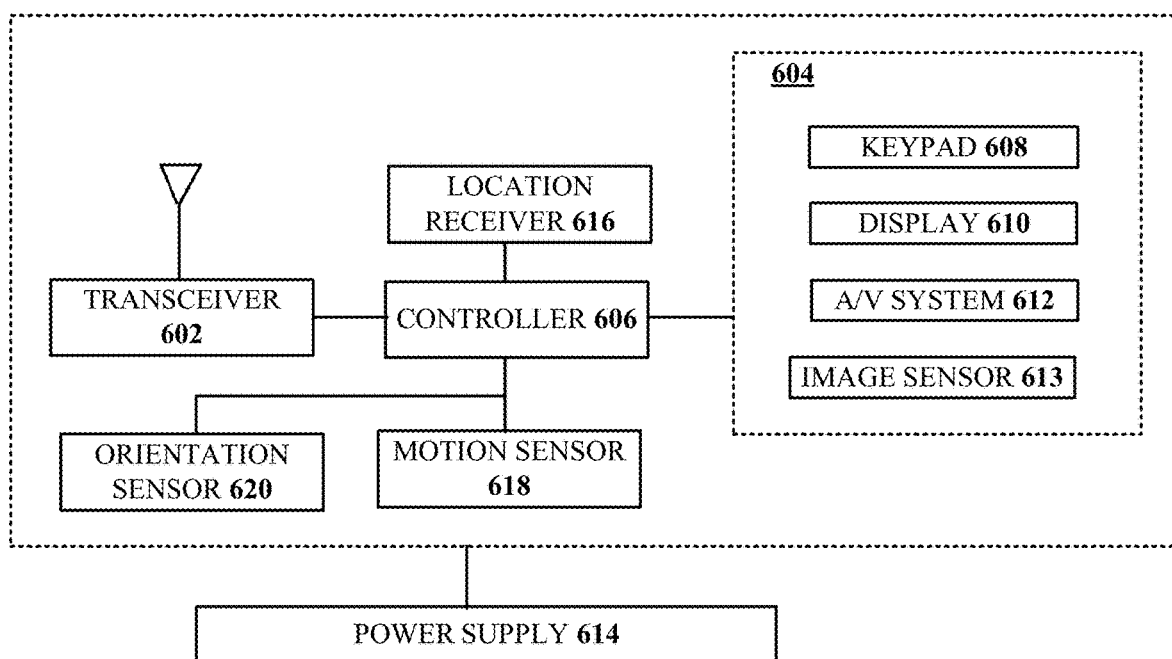
FIG. 6 is a block diagram of an example, non-limiting embodiment of a communication device in accordance with various aspects described herein.

Turning now to FIG. 6, an illustrative embodiment of a communication device 600 is shown. The communication device 600 can serve as an illustrative embodiment of devices such as data terminals 114, mobile devices 124, vehicle 126, display devices 144 or other client devices for communication via communications network 125. For example, computing device 600 can facilitate, in whole or in part, low-latency, low-power data handoff between two asynchronous clock domains as described herein with respect to one or more of FIGS. 2A-2D.

The communication device 600 can comprise a wireline and/or wireless transceiver 602 (herein transceiver 602), a user interface (UI) 604, a power supply 614, a location receiver 616, a motion sensor 618, an orientation sensor 620, and a controller 606 for managing operations thereof. The transceiver 602 can support short-range or long-range wireless access technologies such as Bluetooth®, ZigBee®, Wi-Fi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1×, UMTS/HSDPA, GSM/GPRS, TDMA/EDGE, EV/DO, WiMAX, SDR, LTE, as well as other next generation wireless communication technologies as they arise. The transceiver 602 can also be adapted to support circuit-switched wireline access technologies (such as PSTN), packet-switched wireline access technologies (such as TCP/IP, VoIP, etc.), and combinations thereof.

The UI 604 can include a depressible or touch-sensitive keypad 608 with a navigation mechanism such as a roller ball, a joystick, a mouse, or a navigation disk for manipulating operations of the communication device 600. The keypad 608 can be an integral part of a housing assembly of the communication device 600 or an independent device operably coupled thereto by a tethered wireline interface (such as a USB cable) or a wireless interface supporting for example Bluetooth®. The keypad 608 can represent a numeric keypad commonly used by phones, and/or a QWERTY keypad with alphanumeric keys. The UI 604 can further include a display 610 such as monochrome or color LCD (Liquid Crystal Display), OLED (Organic Light Emitting Diode) or other suitable display technology for conveying images to an end user of the communication device 600. In an embodiment where the display 610 is touch-sensitive, a portion or all of the keypad 608 can be presented by way of the display 610 with navigation features.

The display 610 can use touch screen technology to also serve as a user interface for detecting user input. As a touch screen display, the communication device 600 can be adapted to present a user interface having graphical user interface (GUI) elements that can be selected by a user with a touch of a finger. The display 610 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 610 can be an integral part of the housing assembly of the communication device 600 or an independent device communicatively coupled thereto by a tethered wireline interface (such as a cable) or a wireless interface.

The UI 604 can also include an audio system 612 that utilizes audio technology for conveying low volume audio (such as audio heard in proximity of a human ear) and high volume audio (such as speakerphone for hands free operation). The audio system 612 can further include a microphone for receiving audible signals of an end user. The audio system 612 can also be used for voice recognition applications. The UI 604 can further include an image sensor 613 such as a charged coupled device (CCD) camera for capturing still or moving images.

The power supply 614 can utilize common power management technologies such as replaceable and rechargeable batteries, supply regulation technologies, and/or charging system technologies for supplying energy to the components of the communication device 600 to facilitate long-range or short-range portable communications. Alternatively, or in combination, the charging system can utilize external power sources such as DC power supplied over a physical interface such as a USB port or other suitable tethering technologies.

The location receiver 616 can utilize location technology such as a global positioning system (GPS) receiver capable of assisted GPS for identifying a location of the communication device 600 based on signals generated by a constellation of GPS satellites, which can be used for facilitating location services such as navigation. The motion sensor 618 can utilize motion sensing technology such as an accelerometer, a gyroscope, or other suitable motion sensing technology to detect motion of the communication device 600 in three-dimensional space. The orientation sensor 620 can utilize orientation sensing technology such as a magnetometer to detect the orientation of the communication device 600 (north, south, west, and east, as well as combined orientations in degrees, minutes, or other suitable orientation metrics).

The communication device 600 can use the transceiver 602 to also determine a proximity to a cellular, Wi-Fi, Bluetooth®, or other wireless access points by sensing techniques such as utilizing a received signal strength indicator (RSSI) and/or signal time of arrival (TOA) or time of flight (TOF) measurements. The controller 606 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 600.

Other components not shown in FIG. 6 can be used in one or more embodiments of the subject disclosure. For instance, the communication device 600 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SL- DRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

In one or more embodiments, information regarding use of services can be generated including services being accessed, media consumption history, user preferences, and so forth. This information can be obtained by various methods including user input, detecting types of communications (e.g., video content vs. audio content), analysis of content streams, sampling, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

Some of the embodiments described herein can also employ artificial intelligence (AI) to facilitate automating one or more features described herein. The embodiments (e.g., in connection with automatically identifying acquired cell sites that provide a maximum value/benefit after addition to an existing communications network) can employ various AI-based schemes for conducting various embodiments thereof. Moreover, the classifier can be employed to determine a ranking or priority of each cell site of the acquired network. A classifier is a function that maps an input attribute vector, $x=(x1, x2, x3, x4, \ldots, xn)$, to a confidence that the input belongs to a class, that is, $f(x)$ =confidence(class). Such classification can employ a probabilistic and/or statistical-based analysis (e.g., factoring into the analysis utilities and costs) to determine or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to predetermined criteria which of the acquired cell sites will benefit a maximum number of subscribers and/or which of the acquired cell sites will add minimum value to the existing communications network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to," "coupled to," and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A device, comprising:
a phase rotator configured to receive a read clock;
a flip flop configured to obtain an incoming data stream; and
a controller configured to:
control the phase rotator to perform phase rotation of the read clock based on information-carrying level transitions in the incoming data stream;
cause a gapped read clock and an inversion of the gapped read clock to be derived in accordance with the phase rotation, the gapped read clock being derived via gapping operations associated with the read clock; and
output clock selection signals that enable the flip flop to selectively sample the incoming data stream using the gapped read clock and the inversion, thereby facilitating a data handoff between asynchronous clock domains.

2. The device of claim 1, wherein the clock selection signals provide for phase relationships between sampling clock edges at the flip flop and transitions in the incoming data stream that satisfy a timing margin requirement.

3. The device of claim 1, wherein the phase rotator or the controller is further configured to output wraparound signals indicative of wraparounds of the phase rotator, and wherein the device further comprises:
a wraparound signal detector configured to generate pulses based on the wraparound signals; and
one or more logical components configured to output the gapped read clock in accordance with the pulses.

4. The device of claim 1, further comprising an inverter configured to:
receive the gapped read clock; and
output the inversion, wherein use of the inversion for selective sampling of the incoming data stream enables a timing margin requirement to be satisfied.

5. The device of claim 1, further comprising a multiplexor having an output coupled to the flip flop, wherein the multiplexor is configured to:
receive the clock selection signals, the gapped read clock, and the inversion; and
selectively output, to the flip flop, the gapped read clock and the inversion based on the clock selection signals.

6. The device of claim 1, wherein the phase rotator is further configured to generate a write clock based on the phase rotation.

7. The device of claim 6, further comprising:
a first additional flip flop that operates based on the write clock;
a second additional flip flop that operates based on the gapped read clock; or
a combination thereof.

8. The device of claim 6, wherein the controller is further configured to perform calibration based on an identified phase difference between the read clock and the write clock.

9. The device of claim 1, wherein the read clock is faster than an expected frequency of the transitions by a predefined number of parts per million (ppm), wherein the controller is further configured to receive a source clock associated with the incoming data stream, and wherein the transitions are identified based on the source clock.

10. The device of claim 1, wherein the clock selection signals switch every half rotation of the phase rotator.

11. The device of claim 1, further comprising:
an additional flip flop configured to obtain an additional incoming data stream; and
an additional phase rotator configured to receive the read clock, wherein the controller is further configured to:
output additional clock selection signals that enable the additional flip flop to selectively sample the additional incoming data stream using an additional gapped read clock and an inversion of the additional gapped read clock, wherein outputs of the flip flop and the additional flip flop are provided to a common clock domain.

12. A system, comprising:
a phase rotator configured to receive a read clock;
a sampling device configured to obtain an incoming data stream; and
a controller configured to:
control the phase rotator to perform phase rotation of the read clock based on information-carrying level transitions in the incoming data stream;
cause a gapped read clock and an inversion of the gapped read clock to be derived in accordance with the phase rotation, the gapped read clock being derived via gapping operations associated with the read clock; and
output clock selection signals that enable the sampling device to selectively sample the incoming data stream using the gapped read clock and the inversion, thereby facilitating a data handoff between asynchronous clock domains.

13. The system of claim 12, wherein the controller is further configured to receive a source clock associated with the incoming data stream, and wherein the transitions are identified based on the source clock.

14. The system of claim 12, wherein the phase rotator or the controller is further configured to output wraparound signals indicative of wraparounds of the phase rotator, and wherein the system further comprises:
a wraparound signal detector configured to generate pulses based on the wraparound signals; and
one or more logical components configured to output the gapped read clock in accordance with the pulses.

15. The system of claim 12, further comprising an inverter configured to:
receive the gapped read clock; and
output the inversion, wherein use of the inversion for selective sampling of the incoming data stream enables a timing margin requirement to be satisfied.

16. The system of claim 12, further comprising a multiplexor having an output coupled to the sampling device, wherein the multiplexor is configured to:
receive the clock selection signals, the gapped read clock, and the inversion; and
selectively output, to the sampling device, the gapped read clock and the inversion based on the clock selection signals.

17. A method, comprising:
receiving, by a phase rotator, a read clock;
obtaining, by a flip flop, an incoming data stream;
controlling, by a controller, the phase rotator to perform phase rotation of the read clock based on information-carrying level transitions in the incoming data stream;
causing, by the controller, a gapped read clock and an inversion of the gapped read clock to be derived in accordance with the phase rotation, the gapped read clock being derived via gapping operations associated with the read clock; and outputting, by the controller, clock selection signals that enable the flip flop to selectively sample the incoming data stream using the gapped read clock and the inversion, thereby facilitating a data handoff between asynchronous clock domains.

18. The method of claim 17, wherein the clock selection signals provide for phase relationships between sampling clock edges at the flip flop and transitions in the incoming data stream that satisfy a timing margin requirement.

19. The method of claim 17, wherein the clock selection signals switch every half rotation of the phase rotator.

20. The method of claim 17, wherein the phase rotator is further configured to generate a write clock based on the phase rotation.

* * * * *